United States Patent [19]

Steingroever et al.

[11] 4,449,095
[45] May 15, 1984

[54] PROCESS AND APPARATUS FOR RECORDING HYSTERESIS CURVES OF MAGNETIC MATERIALS

[76] Inventors: Erich Steingroever, Flensburger Strasse 33, 53 Bonn am Rhein; Dietrich Steingroever, Bergisch-Gladbach, both of Fed. Rep. of Germany

[21] Appl. No.: 284,976

[22] Filed: Jul. 20, 1981

[30] Foreign Application Priority Data

Jul. 26, 1980 [DE] Fed. Rep. of Germany ....... 3028410

[51] Int. Cl.³ .................. G01R 33/14; G01N 27/72
[52] U.S. Cl. .................................................. 324/223
[58] Field of Search ............... 324/222, 223, 224, 112, 324/227, 228

[56] References Cited

U.S. PATENT DOCUMENTS

| | | | |
|---|---|---|---|
| 3,500,180 | 3/1970 | Mogilevsky | 324/223 X |
| 3,925,725 | 12/1975 | Mogilevsky et al. | 324/223 X |
| 4,290,014 | 9/1981 | Tremaine | 324/112 X |

FOREIGN PATENT DOCUMENTS

| | | | |
|---|---|---|---|
| 269300 | 4/1970 | U.S.S.R. | 324/223 |
| 601642 | 11/1976 | U.S.S.R. | 324/223 |

OTHER PUBLICATIONS

Plassard, "Hysteresisgraph with Discontinuous Sweep Mode", *Journal of Magnetism and Magnetic Materials*, Apr. 11, 1980, pp. 260-262, North-Holland Publishing Company.

Kasinov et al., "Nondestructive Methods of Testing", Ind. Lab. (U.S.A.), vol. 42, No. 12, Dec. 1976, pp. 1870-1873.

Viles, "Storage and Display of X-Y Information", Maroni Instrumentation, vol. 14, No. 3, 1974, pp. 61-64.

"Model 610B Transient Recorder Operating and Service Manual", Biomation, Jan. 15, 1972, pp. 1-4, 4.3, 5.1.

*Primary Examiner*—Gerard R. Strecker
*Assistant Examiner*—Warren S. Edmonds
*Attorney, Agent, or Firm*—George H. Mitchell, Jr.

[57] ABSTRACT

A process for measuring the hysteresis curve of magnetic materials comprises the generation of a magnetic field of varying amplitude, placing the sample to be measured into that field with a measuring coil and a potential coil attached thereto, integrating the signals from those coils to provide simultaneous values of flux density B and internal field intensity H, recording and storing the B and H values and converting these values to digital units in a transient recorder in real time and then feeding these signals to an X-Y recorder, a printer or other display device at a slower rate of speed to provide a hysteresis curve, or a display of programmed values of magnetic characteristics of the sample being measured.

13 Claims, 2 Drawing Figures

PROCESS AND APPARATUS FOR RECORDING HYSTERESIS CURVES OF MAGNETIC MATERIALS

BACKGROUND OF THE INVENTION

The invention concerns a measuring process for the hysteresis curve B(H) and J(H) of magnetic materials. It is used during measurement on soft and hard magnetic materials.

It is known that hysteresis curves of soft and hard magnetic materials can be measured in such a way that the measuring signals generated by measuring elements arranged on the samples are sent to an X-Y recorder after amplification and possible integration of the B signals, so that in the case of a slow change in the magnetized internal field strength H, the desired curve of the flux density B(H) or polarization $J(H)=B-\mu_o \cdot H$ are recorded. This known process does not permit recording or measuring at higher frequencies than a few Hz in the case of soft magnetic metals, whereas, in the case of hard magnetic materials, it requires a great effort to produce the field intensity needed for saturation in a measuring yoke.

SUMMARY OF THE INVENTION

The invention avoids these disadvantages. It concerns a test procedure for the hysteresis curves of magnetic materials and is characterized by the fact that the measurements for a flux density B and for the polarization J and internal field intensity H are each recorded simultaneously, or synchronously, in a channel of a rapid digital recorder (transient recorder) and then either printed out slowly as a hysteresis curve and/or the values for individual points of the curve (remanence $B_r$, coercive field intensity $H_C$, etc.) are displayed or printed out.

In the case of measurements with soft magnetic materials, any high frequencies and any curve shapes (sine, rectangle, triangle), can be used in accordance with the invention, and there will nonetheless be slow recording of the corresponding curves or displays of the values.

In the case of permanently magnetized materials, the external hysteresis curve can be recorded, in accordance with the invention, in the first and second quadrants if at least the first amplitude of the field H is sufficient for saturation, and the second (i.e., the first negative) amplitude is greater than the coercive field intensity $_JH_C$ of the polarization J. In accordance with the invention, such a field intensity can be generated with relatively little effort by periodic discharge of a capacitor with decreasing amplitude in an electrical resonant circuit in which the inductivity is designed as a magnetizing coil. This is true particularly during the measurement of high coercive ferrite, alnico or rare-earth cobalt magnets.

To record a hysteresis curve, for example, a two-channel transient recorder with 4K recording positions and 8-bit resolution is suitable.

If the measuring process of the invention is applied to metals, the frequency of the magnetizing field should be kept so low that there are no disturbing eddy currents that could disturb the measurement.

In a known manner, the magnetic values B and H of the sample are determined with measuring elements arranged on it.

DETAILED DESCRIPTION OF THE INVENTION

Figure 1:
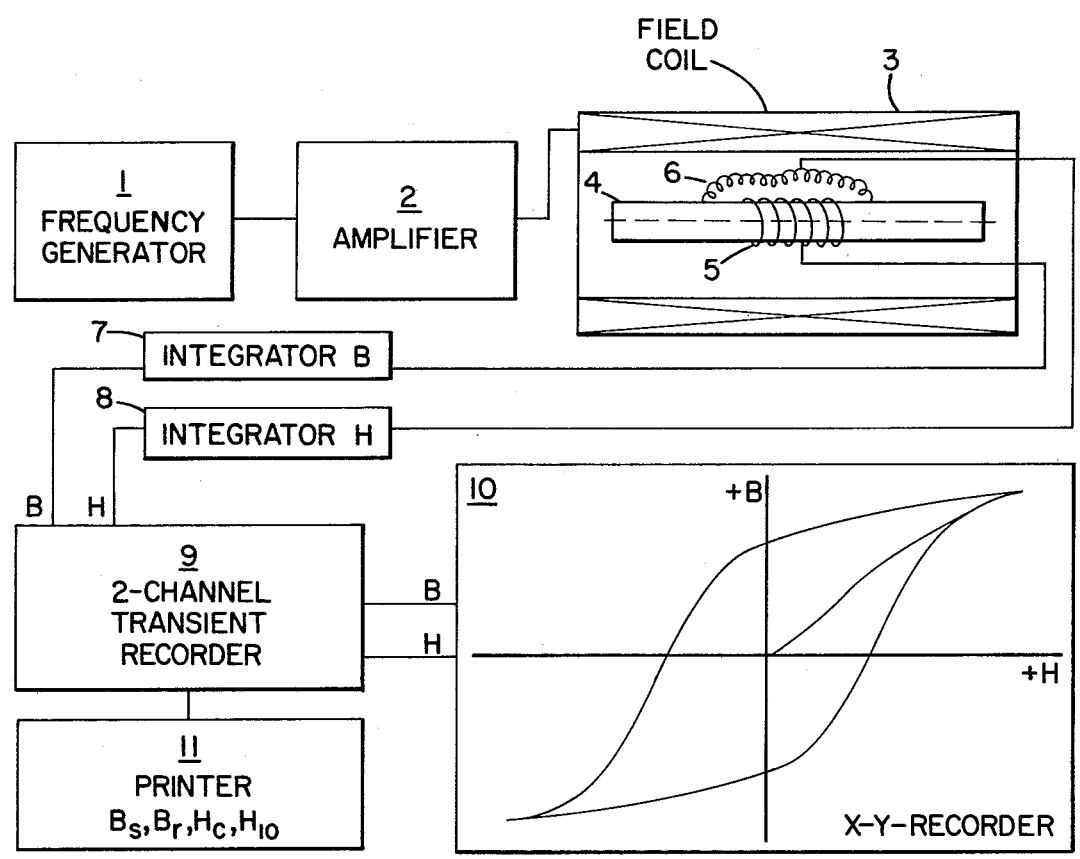
FIG. 1 is a schematic diagram of a preferred arrangement of components for recording hysteresis curves; particularly of soft magnetic materials.

In FIG. 1, numeral 1 denotes a frequency generator which is adjustable both as to frequency and as to the curve of the output signal. If necessary the output of the generator 1 may be fed by an amplifier to energize a hollow field coil 3 to generate an alternating magnetic field therein, within which field the sample 4 is disposed. Sample 4 may be in the form of a rod, or a strip of metal such as, for example, an Epstein sample.

A coil 5, for measuring flux density B surrounds the sample 4 and an elongated potential coil 6, for measuring the internal field intensity, has its respective ends butting against the sample at spaced locations. A pair of electrical integrators 7 and 8 are connected, respectively, to the measuring coil 5 and potential coil 6 to integrate the signal dB/t of coil 5 and signal dH/t of coil 6. The outputs of the integrators 7 and 8 are each fed separately to two separate channels of a transient recorder 9 where the values are stored. Transient recorders, which are well-known in the art have the capability of converting complex waveforms in real time into digital units for storage by means of analog-to-digital conversion circuitry, and to allow these values to be retrieved at a slow speed.

The two output channels B and H, when connected to an X-Y recorder can then be used to plot the hysteresis curve with values of H being displayed along the X axis and the values of B along the Y axis in the usual way.

In addition, the outputs of the transient recorder 9 may also be connected to a printer 11, or a visual display, so that by choosing the proper instantaneous values of B and H various characteristics of the sample 4 may be obtained, for example, remanence $B_r$; coercive field intensity $_BH_C$; or the field intensity for a specific flux density, such as $H_{10}$, designating a flux density of 10,000 gauss.

In FIG. 1, the outputs of channels B and H, of the transient recorder 9 are shown as being connected to an X-Y recorder so that when the signals are sent simultaneously at a slow rate of speed the hysteresis curve of the sample 4 may be reproduced.

Figure 2:
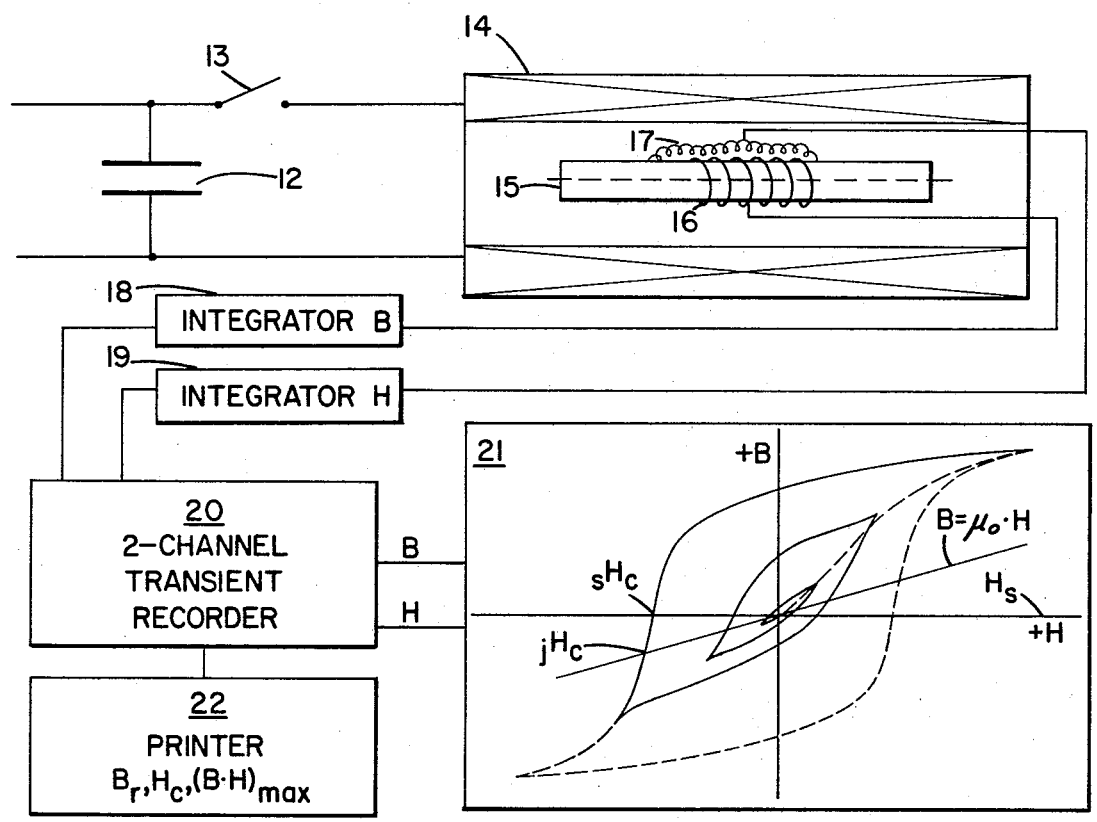
FIG. 2 is a schematic diagram of hysteresis curve recorder for hard magnetic materials.

In the form of the invention shown in FIG. 2 the source of the magnetic field includes a capacitor 12 which can be charged to a desired adjustable voltage from a voltage source (not shown). The capacitor 12 is connected to a field coil 14 be means of a high current-carrying switch means 13, such as an ignitron or thyristor. The field coil 14, having an inductance L is dimensioned in such a way that when it is energized by discharge of capacitor 12 having a capacitance C, an oscillating discharge will occur, thereby generating an oscillating magnetic field within the field coil, within which the sample 15 is placed for measuring.

As in the first modification, a measuring coil 16 closely encircles the sample 15 for measuring the flux density B to which the sample is subjected, while internal field intensity H is measured by a potential coil 17 having its opposite ends butted against the sample 15.

The output of measuring coil 16 is fed to an integrator 18 which integrates the signal dB/dt from the coil to provide a signal B(t) while the output of potential coil 17 is fed to an integrator 19 which integrates the signal dH/dt from the coil to provide a signal H(t). The two signals are supplied separately to two channels of a transient recorder 20 in real time where the signals are digitized and recorded for later use, either to operate an X-Y recorder 21 to convert the stored material into analog form to provide selected portions, or the complete, hysteresis curve of sample 15. The recorder 20 may also be connected to a printer 22 so that, when properly programmed, the recorder may signal the printer to display various characteristics of sample 15, such as $B_r$; $H_c$ or $(B \cdot H)_{max}$.

In both figures, many of the connections between components have been shown as a single line, but it will be understood that these lines represent conventional multi-wire connections.

In the design of the invention shown in FIG. 2 the oscillating (periodic) discharge of the capacitor 12 in coil 14 generates an oscillating magnetic field. This field should be strong enough, in accordance with the invention, that the first (positive) amplitude $H_s$ is sufficient for magnetic saturation of the sample, and the second (negative) amplitude is at least as great as the coercive field intensity $_JH_C$ of the sample. If the hysteresis curve B(H) is to be measured, this second amplitude must be at least as strong as the coercive field intensity $_BH_C$ of the B(H) curve; if the hysteresis curve J(H) is to be measured, it must be at least as strong as the coercive field intensity $_JH_C$ of the J(H) curve. Of the measurement recorded in transient recorder 20, one has the option of recording either only the demagnetization curve up to $_BH_C$ or $_JH_C$ (the complete recording) or the adjacent internal hysteresis loops as well. In accordance with the invention the discharge can be dimensioned such that, as shown in FIG. 2, the sample is completely demagnetized after the discharge is over.

In accordance with the invention, individual values of the hysteresis curve, e.g., the remanence $B_r$, the coercive field intensity $_BH_C$ and $_JH_C$ or the product $(B \cdot H)_{max}$ can be indicated with the indicator or printer 22.

What is claimed is:

1. Process for measuring the hysteresis curve of a magnetic material comprising the steps of:
    subjecting a magnetic material for a period of time to an alternating magnetic field of decreasing amplitude generated by periodic discharge of a capacitor connected with a field coil;
    measuring the flux density B to which said magnetic material is subjected and the internal field intensity H of said material during said period of time;
    converting the values of B and H into digital units and recording said digital units of B and H separately and simultaneously in real time, and;
    retrieving from said stored units in the form of electrical signals at least one value of units for each of both B and H which were stored at a given instant in time.

2. Process of claim 1, wherein said electrical signals for one instant of time are fed to a digital display to display a specific characteristic of the measured material, such as remanence $B_r$ or coercive field intensity $H_C$.

3. Process of claim 1, wherein a succession of said signals are fed to an analog display device, such as an X-Y recorder to provide at least a portion of a hysteresis curve of the measured material.

4. Process of claim 1, wherein a succession of said signals are fed to a digital display device, such as a printer.

5. Process of any one of claims 1, 2 or 3, wherein the material being measured is a soft magnetic material.

6. Process of claim 5, which includes the step of subjecting the material to be measured to an alternating magnetic field having an adjustable curve shape and frequency.

7. Process of any one of claims 1, 2 or 3, wherein the material being measured is a hard magnetic material.

8. Process of any one of claims 1, 2 or 3, which includes the steps of subjecting the material to be measured to a magnetic field having a first polarity and an amplitude sufficient to saturate said material and a second amplitude of reversed polarity greater than the coercive field intensity $_JH_C$ of the measured material.

9. Process of any one of claims 1, 2 or 3 which includes the step of subjecting the material to be measured to an alternating magnetic field having a frequency insufficient to create eddy current that could distort measurements.

10. Process of any one of claims 1, 2 or 3, wherein electrical values of said flux density B and internal field intensity H are obtained by means of sensing instruments mounted on the material to be measured.

11. Apparatus for measuring the hysteresis curve of a magnetic material, comprising:
    means to generate an alternating magnetic field of short duration having a high initial amplitude with a decreasing amplitude thereafter within which field a sample to be measured may be placed;
    measuring coil means and potential coil means, both to be attached to said sample;
    integrating means connected with said measuring coil means and potential coil means for converting electrical values detected by said coils into respective electrical signals indicating values of flux density B and internal field intensity H of said sample while in said magnetic field;
    transient recorder means having at least two channels connected to said integrating means for recording and storing said values of B and H in real time, and for converting said values into digital units; and
    display means connected to the output of said transient recorder means for displaying at least one set of simultaneous values of B and H.

12. Apparatus defined in claim 11, wherein said display means is an X-Y recorder for recording at a lower speed at least a portion of the hysteresis curve of said sample.

13. Apparatus defined in claim 11, wherein said display means is a printer for recording simultaneous values of B and H, or programmed characteristics of said sample derived from said values of B and H.

* * * * *